United States Patent [19]
Doye et al.

[11] Patent Number: 6,025,558
[45] Date of Patent: Feb. 15, 2000

[54] ELECTRICAL CABLE MANAGEMENT SYSTEM

[75] Inventors: Dennis Lee Doye, Maumelle; Michael J. Miskin; J. Michael Nauman, both of Little Rock; Dennis D. Taylor, Maumelle, all of Ark.

[73] Assignee: Molex Incorporated, Lisle, Ill.

[21] Appl. No.: 09/005,309

[22] Filed: Jan. 9, 1998

[51] Int. Cl.⁷ .................................................. H01B 3/14
[52] U.S. Cl. ........................... 174/68.1; 174/74; 174/95; 174/135; 52/39
[58] Field of Search ................. 174/68.1, 72 A, 174/72 R, 96, 99 R, 70 R, 71 R, 95, 97, 135; 52/39, 712

[56] References Cited

U.S. PATENT DOCUMENTS

| | | | |
|---|---|---|---|
| 2,470,788 | 5/1949 | O'Brien et al. | 174/99 E |
| 2,917,083 | 12/1959 | Duvall et al. | 285/284.1 |
| 3,055,971 | 9/1962 | Lander | 174/72 A |
| 3,273,213 | 9/1966 | Zurkowski | 24/298 |
| 4,373,111 | 2/1983 | Myers et al. | 174/48 |
| 4,621,992 | 11/1986 | Angott | 417/572 |
| 4,776,809 | 10/1988 | Hall | 439/116 |
| 4,991,265 | 2/1991 | Campbell et al. | 24/16 PB |
| 5,064,970 | 11/1991 | Bennett et al. | 174/135 |
| 5,580,014 | 12/1996 | Rinderer | 248/49 |

*Primary Examiner*—Kristine Kincaid
*Assistant Examiner*—Dhiru R Patel
*Attorney, Agent, or Firm*—A. A. Tirva

[57] ABSTRACT

An electrical cable management system is disclosed for dressing electrical cables, such as the cables of wiring harnesses, on appropriate support structures, such as within electrical connector cabinets. A cable support member has a hanger for hanging the support member on a support structure. At least one cable tie member embraces a cable and ties the cable to the cable support member.

13 Claims, 2 Drawing Sheets

ELECTRICAL CABLE MANAGEMENT SYSTEM

FIELD OF THE INVENTION

This invention generally relates to the art of electrical transmission and, particularly, to an electrical cable management system for dressing the cables of wiring harnesses on support structures, such as within an electrical connector cabinet.

BACKGROUND OF THE INVENTION

Wiring harnesses are used in a wide variety of applications, such as to interconnect telecommunication equipment. A wiring harness is preformed of a cable made up of many electrical conductors cut to predetermined lengths and having ends terminated to connectors.

In use, an end user establishes the required connections between pieces of equipment by mating the terminating connectors on the cables to connectors mounted on the pieces of equipment. The interconnecting cables of the harnesses often are left hanging unsupported, i.e. supported only by the connectors. The weight of the cables may place undue stress and load on the connector housings. In addition, loosely hanging cables may come into contact with sharp corners of an equipment support structure, such as an electrical connector cabinet, which may eventually result in shorting of some of the conductors of the cables.

In order to solve these problems without requiring any substantial change to the supporting structures, electrical equipment or connector cabinets with which the wiring harnesses are used, the present invention is directed to providing a very simple cable management system which includes a unique cable support member that can be simply hung on the support structure or the equipment or within an electrical connector cabinet, for instance. In fact, the cable support member of the system can be shipped with one or more wiring harnesses already tied thereto and hung in place by the end user, even before the end user connects the connectors at the ends of the wiring harness cables.

SUMMARY OF THE INVENTION

An object, therefore, of the invention is to provide an electrical cable management system for dressing electrical cables, such as the cables of wiring harnesses, on a support structure, such as within an electrical connector cabinet.

In the preferred embodiment, the electrical cable management system includes a cable support member having hanger means for hanging the support member in the connector cabinet. At least one cable tie member is provided for embracing a cable and attaching the cable to the cable support member.

As disclosed herein, the cable support member is an elongated, thin and narrow one-piece structure. For instance, the support member can be stamped from sheet metal material such as aluminum. The hanger means may be provided by a simple hook at one end of the elongated support member. Notches are stamped out of the longitudinal edges of the support member to define shoulder means for engagement by one or more cable tie members to hold the cable tie members and, therefore, the cables at given positions along the elongated cable support member. In place of notches, openings of various shapes may also be used. The cable ties may comprise hook and loop type tapes, cable ties, tape etc.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 4:
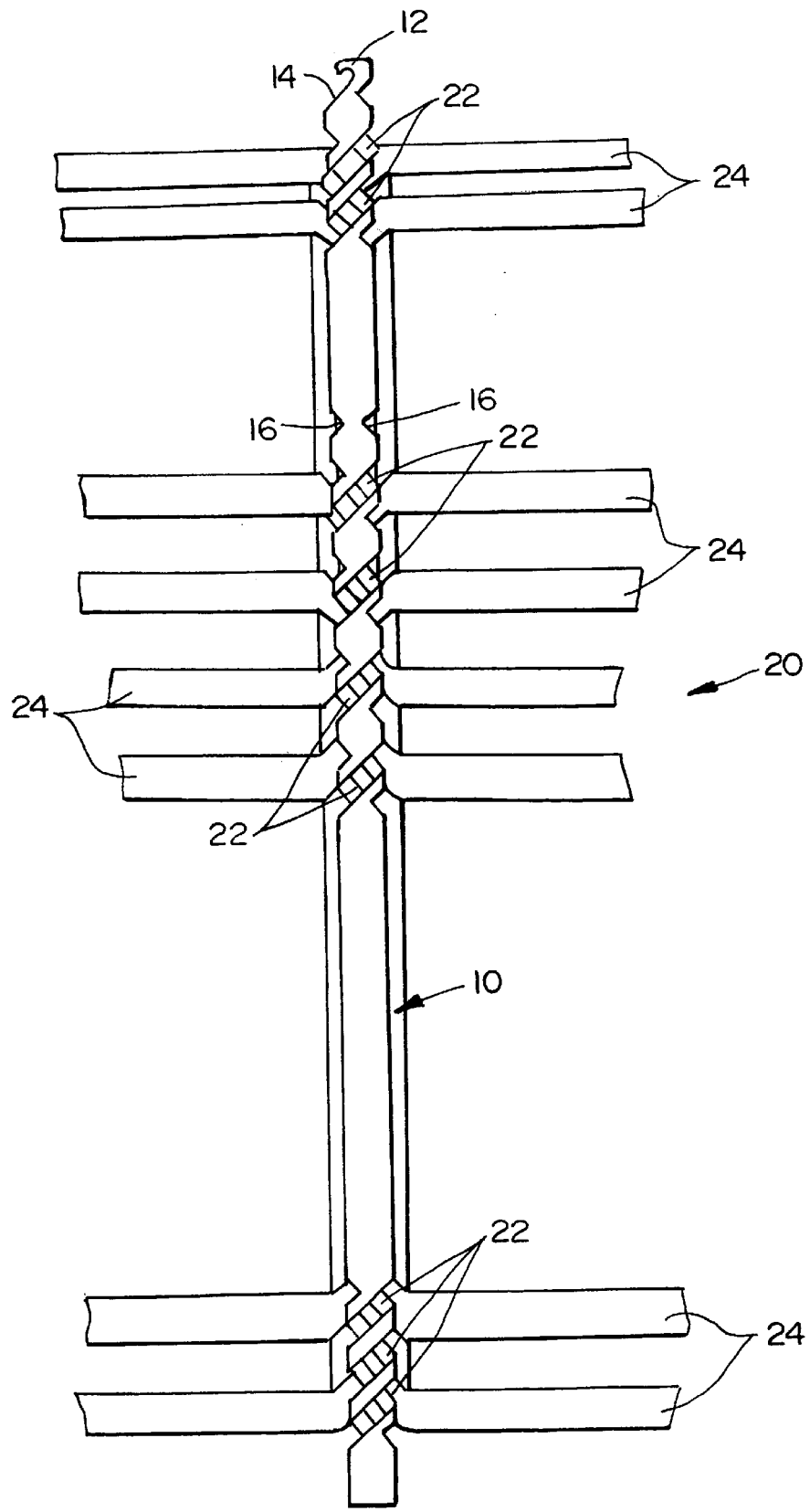
FIG. 4 is an elevational view of the support member used in an electrical cable management system according to the invention and including a plurality of cable tie members shown tieing a plurality of cables at various positions longitudinally of the support member.

The invention is incorporated in an electrical cable management system which is shown in FIG. 4, for dressing electrical cables, such as the cables of wiring harnesses, on a support structure, such as within an electrical connector cabinet. As stated in the "Background", above, it is well known that a typical wiring harness is a preformed assembly of a cable made up of many electrical conductors cut to predetermined lengths and having ends terminated to connectors. The following description, including the system of FIG. 4, will be discussed primarily in relation to dressing of electrical cables, it being understood that the invention can be used for a wide variety of application, including but not limited to the cables of typical wiring harnesses.

Figure 1:
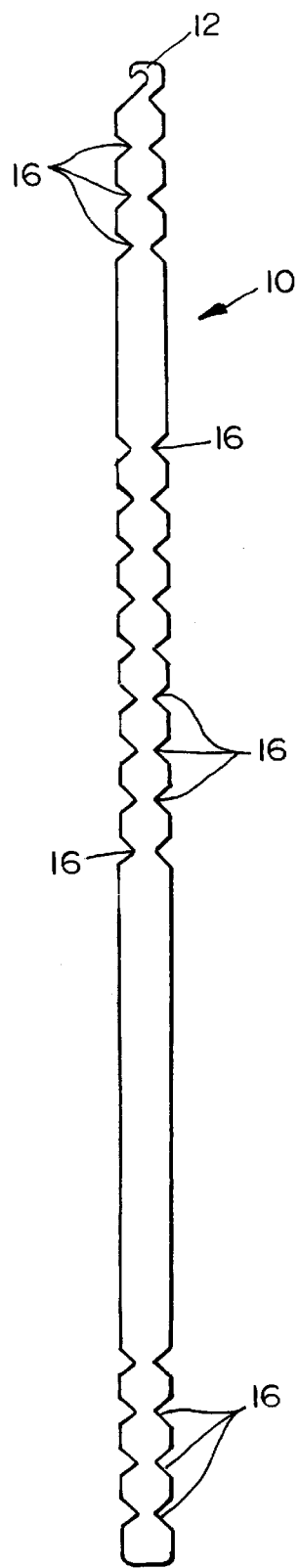
FIG. 1 is a side elevational view of the cable support member of the invention.
Figure 2:
FIG. 2 is an edge elevational view of the support member.
Figure 3:
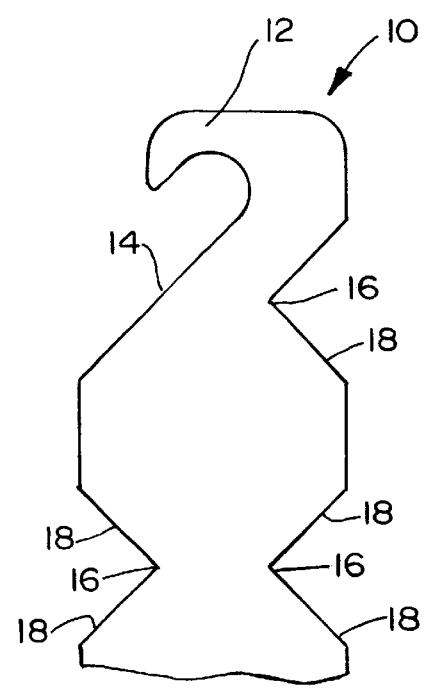
FIG. 3 is an enlarged, fragmented side elevational view of the hanging end of the support member.

With that understanding, reference first is made to FIGS. 1–3 wherein a cable support member or cable support strip, generally designated 10, is shown. It can be seen that the cable support strip is an elongated, thin and narrow structure. The entire cable support strip is a one-piece structure and can be stamped and formed from sheet metal material, such as aluminum. Of course, the cable support strip can be fabricated of other materials, such as dielectric or plastic materials.

Elongated cable support strip 10 includes hanger means in the form of a hook 12 at its top end for hanging the cable support strip on an appropriate support structure, such as within an electrical connector cabinet. The strip is stamped with a lead-in surface 14 for facilitating leading a portion of the support structure into hook 12.

A plurality of notches 16 are stamped out of the edges of cable support strip 10 to define a plurality of angled surfaces or shoulders 18. These shoulders are best seen in FIG. 3 and they provide an irregular edge on cable support strip 10 against which cable ties (described hereinafter) can be engaged to hold the cable ties and, therefore, the cables at given positions longitudinally of the cable support strip. FIG. 1 shows three different groupings of notches 16 and shoulders 18, but the number and locations of the notches obviously can depend on the particular use or application of the cable support strip.

As seen in FIGS. 1 and 3, by providing generally triangular notches 16, the shoulders 18 of sequential notches disposed on opposite edges of the cable support strip are generally parallel. In other words, the bottom shoulder 18 of the top notch 16 on the right-hand edge of support strip 10 as viewed in FIG. 3, is generally parallel to the top shoulder 18 of the top notch 16 stamped in the opposite or left-hand edge of the strip as viewed in FIG. 3. By having the shoulders generally parallel tape-type cable ties are easily used to tie the cables to the support strip.

FIG. 4 shows an electrical cable management system, generally designated 20, incorporating cable support strip 10 of the invention. The support strip is hung on an appropriate support structure by top hook 12. A plurality of cable tie members 22 are used to tie a plurality of cables 24 to the support strip. A preferred cable tie member can be fabricated of hook and loop type tape. Therefore, the tie tapes can be wrapped around shoulders 18 of notches 16 to hold cables 24 at desired positions longitudinally of cable support strip 10. Of course, as stated above, cables 24 may be components of typical preformed wiring harnesses wherein electrical connectors are terminated to opposite ends of the cables.

From the foregoing, it can be understood that the cable management system of the invention can be used in a number of applications. For instance, cable support strip 10 can be hung on an appropriate support structure, such as within an electrical connector cabinet, as a preliminary step. The wiring harnesses, including cables 24, subsequently are secured by cable ties 22 to the support strip either before or after the connectors at the ends of the cables are mated with their respective complementary mating connectors.

On the other hand, a very convenient use of the cable management system of the invention is to tie all of the cables to cable support strip 10 to form a harness subassembly. This entire subassembly can be shipped to the end user, and all the end user does is hang the subassembly by hook 12 on its ultimate support structure. The ends of the cable, i.e. the break-outs, are aligned for correct location in the user's system. The only weight or stresses on the cables thus would be the end connectors themselves which easily can be mated with their appropriate mating connectors after the subassembly already has been hung in place.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. An electrical cable management system for dressing the cables of wiring harnesses on a support structure, comprising: a cable support member having at least one hanger portion for hanging the support member on the support structure, the support member including an elongated body portion of sufficient length to support at least two cables, the support member body portion having a pair of parallel outer opposing side edges, said support member body portion further having a plurality of notches disposed therein and extending along said opposing side edges thereof, said notches being aligned such that one of said notches disposed along one of said parallel outer opposing side edges is aligned with another of said notches disposed along the other of said parallel outer opposing side edges, each of said notches having at least one internal face that extends inwardly of said support member body portion edge, the internal faces of said notches on said parallel outer opposing side edges being aligned with each other; at least one cable tie member for embracing a cable and tieing the cable to the cable support member; said internal faces of said notches providing a pair of surfaces that support portions of said cable tie when said cable tie is wrapped around said support member body portion and said surfaces, so that said cable tie can hold said cable at a given position on said cable support member.

2. The electrical cable management system of claim 1 wherein said cable support member includes a hook.

3. The electrical cable management system of claim 2 wherein said cable support member is a one-piece structure and said hook is integral therewith.

4. The electrical cable management system of claim 1 wherein said cable support member is elongated, with said hook being disposed at one end thereof.

5. The electrical cable management system of claim 4 wherein said elongated cable support member is a thin and narrow strip.

6. The electrical cable management system of claim 5 wherein said cable support member is fabricated from aluminum.

7. The electrical cable management system of claim 1 wherein said cable tie is of a hook and loop type tape.

8. An electrical cable management system for dressing electrical cables on an appropriate support structure, comprising:

an elongated one-piece cable support member having a hook portion disposed at one end therefor for hanging the support member on the support structure, the support member having a predetermined width defined by opposing side edges of said support member, said support member further including a plurality of shoulders disposed longitudinally therealong, the shoulders cooperating with said opposing side edges to form irregular profiles therealong, said shoulders extending inwardly of said opposing side edges, said shoulders each having a triangular configuration with two internal surfaces that meet at an apex, one of said two internal surfaces of said shoulders on one of said opposing side edges being generally aligned with one of said internal surfaces of shoulders on the other of said opposing side edges, said shoulder internal surfaces of said opposing side edges being offset from each other; and a plurality of cable tie members for embracing the cables and engaging said shoulders to tie the cables at given positions on the cable support member.

9. The electrical cable management system of claim 8 wherein said support member is stamped and formed of sheet metal material.

10. The electrical cable management system of claim 8 wherein said cable tie members comprise hook and loop fastening tapes.

11. The electrical cable management system of claim 8 wherein said support member is fabricated from aluminum.

12. The electrical cable management system of claim 8 wherein said shoulders are aligned in offset pairs that are arranged generally parallel to each other and on opposite sides of said support member.

13. An electrical cable support member for supporting a plurality of cables in a preselected arrangement and spacing, comprising:

an elongated body portion, the body portion having a preselected width that extends between two, opposed marginal edges, the body portion marginal edges being generally parallel to each other;

a hanger portion that includes a hook member disposed at one end of said body portion for hanging said support member on a structure;

a cable engagement portion disposed on said body portion, the cable engagement portion including a plurality of notches formed along corresponding portions of said body portion marginal edges, said notches defining shoulder portions disposed within said body portion marginal edges, pairs of said notches on said marginal edges being offset from each other such that said shoulder portions of said pairs of notches are aligned with each other and define, at different preselected locations along said body portion, pairs of engagement surfaces that are angled with respect to said body portion marginal edges around which a cable tie may be wrapped in order to hold a cable at a preselected location on said body portion.

* * * * *